United States Patent [19]
Pan et al.

[11] 4,032,802
[45] June 28, 1977

[54] REDUCTION OF INTERMODULATION

[75] Inventors: Jing Jong Pan; Milton Phillip Arnold, both of Melbourne, Fla.

[73] Assignee: Harris Corporation, Cleveland, Ohio

[22] Filed: Feb. 9, 1976

[21] Appl. No.: 656,160

[52] U.S. Cl. .............................. 307/311; 250/552; 307/200 A

[51] Int. Cl.² ......................................... H03K 3/42

[58] Field of Search ............... 307/311, 317, 202; 250/552

[56] References Cited
UNITED STATES PATENTS

| | | | |
|---|---|---|---|
| 3,432,670 | 3/1960 | Dym | 307/311 |
| 3,462,605 | 8/1969 | Engeler | 350/552 |
| 3,665,442 | 5/1972 | Brooks | 307/311 |
| 3,795,821 | 3/1974 | Ichiyanagi | 307/311 |

Primary Examiner—Stanley D. Miller, Jr.
Assistant Examiner—B. P. Davis

[57] ABSTRACT

A low distortion modulated light source, including a light emitting diode and a compensating diode. These diodes are arranged in parallel for D.C. biasing, and in anti-series with respect to the A.C. signal path. Means are provided for varying the relative biasing of the two devices so as to thereby adjust the A.C. characteristics of the compensating diode to more accurately correspond to the A.C. characteristics of the light emitting diode.

When properly biased, the inherently non-linear junction capacitance of the light emitting diode is compensated so as to substantially eliminate undesired harmonics and intermodulation products.

7 Claims, 4 Drawing Figures

REDUCTION OF INTERMODULATION

The present invention relates to the art modulated light sources and more particularly to distortion reduction in opto-electronic devices.

With the emergence of fiber-optic technologies and the imminent transportation thereof into communication systems and information processing, a need has developed for a light source with both high linearity and low noise characteristics. Light emitting diodes (LED's) and injection laser diodes (ILD's) have been used in these applications with some success. However, the inherently non-linear junction capacitance of these devices creates undesired harmonics and intermodulation products which degrade their performance. These problems have been dealt with in the prior art through improvements in diode fabrication, feedback control, or predistortion techniques. Such methods are generally undesirable because of their high cost and difficulty of manufacture.

It is an object of the present invention to provide apparatus for distortion compensating an opto-electronic light source.

It is a further object of the present invention to provide apparatus for accomplishing this in a simple and inexpensive manner.

In accordance with the present invention, apparatus is provided for connecting an opto-electronic light source and a compensating device in an anti-series relation with respect to the signal path and in parallel for biasing purposes so as to thereby reduce distortion in the light source.

DESCRIPTION OF THE DRAWINGS

The foregoing and other objects and advantages of the present invention will become more readily apparent from the following description of the preferred embodiments of the invention as taken in conjunction with the accompanying drawings which are a part hereof and wherein.

Before proceeding with a physical description of the invention, a brief theoretical discussion will be set forth to facilitate a more comprehensive understanding thereof.

Figure 1:
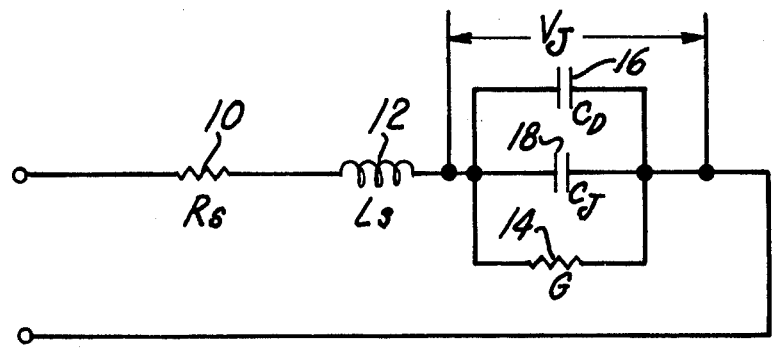
FIG. 1 is a diagram of the equivalent circuit of an opto-electronic device.

Disregarding the packing parasitic effects, the commonly accepted LED or ILD equivalent circuits can be illustrated as shown in FIG. 1. The series resistance 10 represents the sum of the diode excess series resistance and the external circuit resistance. The inductance 12 is mainly due to the bonding wire. Resistance 14 represents the diode resistance. The diode capacitance consists of the diffusion capacitance 16 and the space-charge capacitance 18 in the depletion layers. Since the diffusion capacitance 16 is much smaller than the depletion layer capacitance 18, and also because the depletion layer capacitance 18 is voltage dependent, it is this term 18 which is largely responsible for the harmonic distortion observed. The depletion layer capacitance varies with the total diode area, $A_d$ and the emitting area, $A_e$, but can be approximated as:

$$C_j = \frac{C_o}{(\phi - V_j)^n} \quad (1)$$

when $A_d \gg A_e$
where
$C_o$ is a constant,
$\phi$ denotes the diffusion potential,
$V_j$ is the net voltage at the junction, and
$n$ is a number dependent on the impurity profile of the junction.

If a given bias voltage $V_{jo}$ is applied across the diode with a small modulating voltage $v$ added thereto, the junction voltage can be characterized by the equation:

$$V_j = V_{jo} + v \quad (2)$$

and the diode capacitance can be expressed as:

$$C = \frac{C_o}{(\phi - V_{jo})^n} \left(1 - \frac{v}{\phi - V_{jo}}\right)^{-n} \quad (3)$$

$$= K_o + K_1 v + K_2 v^2 + \ldots \quad (4)$$

where $$K_o = \frac{C_o}{(\phi - V_{jo})^n} \quad (5)$$

$$K_1 = \frac{nK_o}{(\phi - V_{jo})} \quad (6)$$

$$K_2 = \frac{n(n+1)K_o}{2(\phi - V_{jo})^2} \quad (7)$$

The first two voltage dependent terms, respectively representing second and third-order distortions, contribute the major portion of the total harmonic distortion of the system. If these terms can be decreased or eliminated, then the harmonic distortion and intermodulation products of the system will be decreased accordingly.

Figure 2:
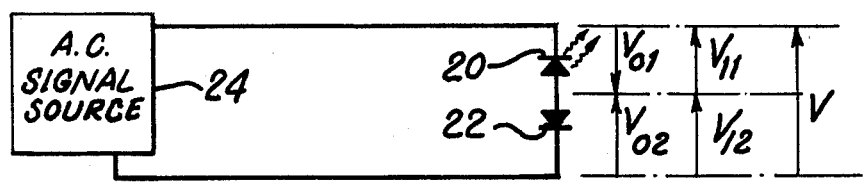
FIG. 2 is a simplified diagram of the present invention, illustrating the A.C. signal path thereof.

The present invention accomplishes this goal by connecting two diodes across the signal source. Thus, as shown in FIG. 2, two diodes 20 and 22 are connected anode to anode, and in series across a signal source 24. This is known in the art as an anti-series connection of the diodes across the signal source. (The term "anti-series" also embraces a cathode to cathode connection of the diodes). Obviously, a biasing network must be added or no signal current will pass through the series connected diodes. For the purposes of the present theoretical description, it will be assumed that diodes 20 and 22 are forward biased by a biasing network (not shown) and in amounts respectively equal to $V_{01}$ and $V_{02}$. Thus, any incremental voltage V applied across the diodes by signal source 24 will serve to modulate the current through the diodes about their respective bias points.

The arrows associated with the voltages listed in FIG. 2 indicate the direction of the voltage. For example, D.C. voltage $V_{01}$ is directed across diode 20 such that the anode thereof is positive with respect to the cathode. Correspondingly, D.C. voltage $V_{02}$ across diode 22 is also of such a direction that the anode thereof is positive with respect to the cathode.

When an incremental A.C. voltage V is applied across diodes 20 and 22, it will divide across the two diodes, forming respective voltages $V_{11}$ and $V_{12}$. The power series respectively associated with the capacitance of each diode can thus be represented by the equations:

$$C_1 = K_{10} + K_{11}V_{11} + K_{12}V_{11}^2 + \ldots \quad (8)$$

$$C_2 = K_{20} - K_{21}V_{12} + K_{22}V_{12}^2 - \ldots \quad (9)$$

It will be understood that these equations follow directly from equation (4). The negative sign in equation (9) arises from the opposing nature of the incremental changes in voltage seen across each of the two diodes; i.e. an incremental change in the voltage across the anti-series connected diodes will add to the D.C. voltage across one and subtract from the D.C. voltage across the other. The coefficients in equations (8) and (9) correspond to the K terms defined in equations (5), (6) and (7), and are determined by the corresponding diode's parameters. The total capacitance can be derived by adding equations (8) and (9) to result in the following equation:

$$C_t = C_1 + C_2 \quad (10)$$

$$= \frac{1}{K_{30}} - \frac{2K_{31}}{K_{30}^3} v + \frac{3}{K_{30}^5}(2K_{31}^2 - K_{30}K_{32})v^2 + \ldots \quad (11)$$

where $$v = v_{11} + v_{12} \quad (12)$$

and $$K_{30} = \frac{1}{K_{10}} + \frac{1}{K_{20}}$$

$$K_{31} = \frac{K_{11}}{2K_{10}^3} - \frac{K_{21}}{2K_{20}^3} \quad (14)$$

$$K_{32} = \frac{\frac{K_{11}^2}{2} - \frac{K_{10}K_{12}}{3}}{K_{10}^5} + \frac{\frac{K_{21}^2}{2} - \frac{K_{20}K_{22}}{3}}{K_{20}^5} \quad (15)$$

If two identical diodes were utilized, the corresponding coefficients would also be identical, e.g. $K_{10} = K_{20}$, $K_{11} = K_{21}$, etc. Equation (11) could then be reduced to:

$$C_t = \frac{K_{10}}{2} + \frac{K_{12}}{8}\left[1 - \frac{1.5K_{11}^2}{K_{10}K_{12}}\right]v^2 + \ldots \quad (16)$$

It will be noted that the second order distortion term has dropped out. Also, the $v^2$ term, which causes third order distortion, is reduced by at least a factor of ⅛ and can be reduced to zero when:

$$\frac{1.5K_{11}^2}{K_{10}K_{12}} = 1 \quad (17)$$

When these diodes are not identical, the second-order term may not be cancelled completely. However, it is relatively simple to use similar diodes biased at a certain point such that very low levels of second- and third-order distortions are simultaneously obtained. The second- and third-order distortion can be optimized at a desired distribution by simply adjusting the bias point. The compensating diode need not necessarily be a similar LED or ILD; any diode with similar characteristics can serve the purpose.

Figure 3:
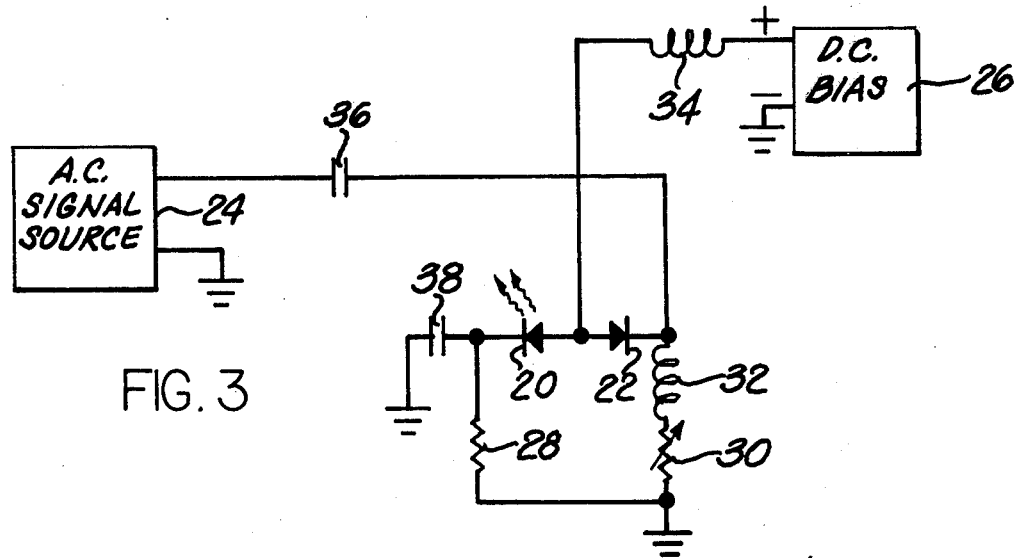
FIG. 3 is a schematic diagram of one embodiment of the present invention.

Referring now to FIG. 3, an operative circuit embodying the present invention is illustrated. As in FIG. 2, two diodes 20 and 22 are connected in anti-series across a signal source 24. Further, a biasing network comprised of a D.C. bias source 26 and dropping resistors 28 and 30 is included. Inductors 32 and 34 are included to prevent shunting of the A.C. signal through the biasing network. Also, capacitors 36 and 38 are connected in series with the diodes across the signal source to prevent shunting of the D.C. bias therethrough. Dropping resistor 30 may conveniently be a variable resistor to allow control of the relative bias points of diodes 20 and 22. As one conversant with this art will immediately recognize, diodes 20 and 22 are connected in parallel for biasing purposes and in anti-series with respect to the signal path. Diodes 20 and 22 are thus forward biased by D.C. bias source 26, and the signal provided by signal source 24 serves to modulate the current through the diodes in the manner previously described. Although diode 20 is pictured as being the light emitting source, the source may conveniently occupy the position of either of the two diodes shown.

Figure 4:
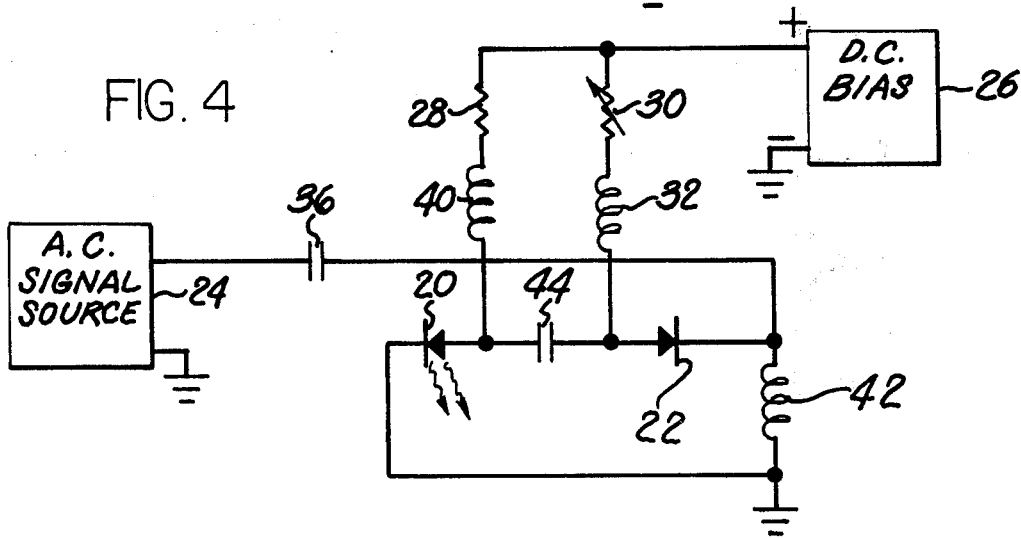
FIG. 4 is a schematic diagram of a second embodiment of the present invention.

Referring now to FIG. 4, one of the many possible variations of circuit elements is shown. In this embodiment, the dropping resistors 28 and 30 are located in the anode circuit of the biasing network, thus requiring the inclusion of the two additional blocking inductors 40 and 42. Also, an additional blocking capacitor 44 is included to allow separate adjustment of the biasing points of the two diodes.

Although the circuit has been described with reference to specific embodiments, it will be appreciated that various alterations and arrangements of parts may be made without departing from the spirit and scope of the invention as disclosed herein. Thus, for example, the diodes may be connected cathode to cathode rather than anode to anode. Also, if identically matched diodes are used such that the biasing points of the two need not be separately adjusted, only a single dropping resistor need be used, allowing a commensurate reduction in the number of blocking inductors required. Thus, for example, referring to FIG. 4, blocking capacitor 44 could be shorted across and resistor 28 and inductor 40 removed. In this way, adjustment of variable resistor 30 would serve to vary the bias points of diodes 22 and 20 simultaneously.

This principle can also be applied to injection laser diodes and photo detectors (APD or PIN) to reduce device non-linearity. Therefore, the embodiments set forth herein are exemplary only and are not intended to limit the scope of the invention as defined by the appended claims.

What is claimed is:

1. A low distortion opto-electronic light source for use with a signal source generating an A.C. signal and comprising,
    semiconductor light source means,
    compensating means having a voltage dependent capacitance characteristic substantially similar to that of said light source means,
    biasing means for applying a biasing current through said light source means and said compensating means, and
    connecting means for connecting said light source means and said compensating means in anti-series across said signal source and in parallel across said biasing means.

2. The device as set forth in claim 1 wherein said compensating means includes diode means.

3. The device as set forth in claim 1 wherein said light source means and said compensating means respectively comprise first and second unipolar semiconductor means.

4. The device as set forth in claim 1 wherein said connecting means comprises first means for connecting said light source means and said compensating means in anti-series across said signal source, and second means for connecting said light source means and said compensating means in parallel across said biasing nmeans.

5. The device as set forth in claim 4 wherein said second means includes variable resistance means for controlling the relative baising of said light source means and said compensating means.

6. The device as set forth in claim 4 wherein said second means includes inductance means for blocking the passage into said biasing means of said A.C. signal generated by said signal source.

7. The device as set forth in claim 4 wherein said first means includes capacitance means for blocking the passage into said signal source of the signal generated by said biasing means.

* * * * *